(12) United States Patent
Kaup et al.

(10) Patent No.: US 12,241,610 B2
(45) Date of Patent: Mar. 4, 2025

(54) LIGHTING DEVICE FOR A MOTOR VEHICLE

(71) Applicant: Hella GmbH & Co. KGaA, Lippstadt (DE)

(72) Inventors: Marc Kaup, Paderborn (DE); Martin Mügge, Geseke (DE); Thomas Rettweiler, Lippstadt (DE)

(73) Assignee: Hella GmbH & Co. KGaA, Lippstadt (DE)

(*) Notice: Subject to any disclaimer, the term of this patent is extended or adjusted under 35 U.S.C. 154(b) by 0 days.

(21) Appl. No.: 18/544,568

(22) Filed: Dec. 19, 2023

(65) Prior Publication Data
US 2024/0210006 A1   Jun. 27, 2024

(30) Foreign Application Priority Data
Dec. 23, 2022   (DE) .................. 102022134044.9

(51) Int. Cl.
| | |
|---|---|
| *F21S 43/249* | (2018.01) |
| *F21S 43/14* | (2018.01) |
| *F21S 43/20* | (2018.01) |
| *F21S 43/31* | (2018.01) |
| *F21Y 115/10* | (2016.01) |
| *H05K 1/18* | (2006.01) |

(52) U.S. Cl.
CPC ............ *F21S 43/249* (2018.01); *F21S 43/14* (2018.01); *F21S 43/26* (2018.01); *F21S 43/31* (2018.01); *H05K 1/181* (2013.01); *F21Y 2115/10* (2016.08); *H05K 2201/10106* (2013.01); *H05K 2201/2054* (2013.01)

(58) Field of Classification Search
CPC ...... F21S 43/26; B60Q 1/503; B60Q 2400/50
See application file for complete search history.

(56) References Cited

U.S. PATENT DOCUMENTS

| | | | |
|---|---|---|---|
| 5,819,454 A | 10/1998 | Rosenitsch | |
| 5,931,566 A * | 8/1999 | Fraizer | F21V 3/04 |
| | | | 362/540 |
| 2021/0302000 A1* | 9/2021 | Sullivan | F21S 43/50 |
| 2022/0185177 A1* | 6/2022 | Baker | B60Q 1/268 |

FOREIGN PATENT DOCUMENTS

| | | |
|---|---|---|
| DE | 102016119326 A1 | 4/2018 |
| DE | 102021129659 A1 | 5/2023 |

* cited by examiner

*Primary Examiner* — Eric T Eide
(74) *Attorney, Agent, or Firm* — Husch Blackwell LLP

(57) ABSTRACT

A lighting device is provided for a motor vehicle. The lighting device contains a printed circuit board populated with light-emitting diodes and a reflector element. The reflector element is on the same side of the printed circuit board as the light-emitting diodes. The reflector element is subdivided into numerous segments. Each light-emitting diode is dedicated to a segment, such that the light from the light-emitting diodes can be reflected away from the printed circuit board by the reflector element in a beam direction (S). An optical element for the lighting device is placed downstream of the reflector element in the beam direction (S). The optical element has different optical properties above the reflective surface of the reflector element.

15 Claims, 15 Drawing Sheets

LIGHTING DEVICE FOR A MOTOR VEHICLE

CROSS REFERENCE

This application claims priority to German Application No. 10 2022 134044.9, filed Dec. 23, 2022, the entirety which is hereby incorporated by reference.

FIELD OF THE INVENTION

The invention relates to a lighting device for a motor vehicle, a lighting system, and a motor vehicle.

BACKGROUND OF THE INVENTION

The design of a pixelated or segmented functional surface in a lamp or lighting device on a motor vehicle is used to define and output a desired lighting symbol or display supplementary information (e.g. numerals, text, pictograms) by switching individual segments/pixels on and off in different patterns. New content or light symbols can be developed therewith while it is used on the motor vehicle, and offered to the owner/operator of the vehicle without needing to develop an new lamp.

DE 10 2016 119 326 A1 discloses a lighting device of this type.

Displays containing light-emitting diodes are known from the prior art, which are also referred to as "LED Displays," or "LED Panels." The LED displays contain a matrix of RGB LEDs, and are used in advertising or as video displays in trade fairs and concerts. These RGB LEDs emit a weak light, for which reason it is not possible to obtain the brightness required by law in the automotive industry with these LED displays using a limited number of LEDs. Furthermore, these LED displays are normally controlled with a video interface, e.g. HDMI, which cannot be used in motor vehicles, in particular because these types of video signals cannot be used, or are inadequate, for lamps or lighting functions. Another disadvantage with these LED displays is the pixelated arrangement of the light-emitting diodes in a matrix. An observer sees a bright point where each LED is located, and a sharp image can only be obtained at close range if the LEDs are very close together, to obtain a high resolution. This is why the light-emitting diodes in these LED panels must be less than 2 mm apart, and are ideally spaced 1 mm or less apart.

For use in the automotive industry, the legally required minimum brightness that must be obtained is 4 cd (candela) for a red taillight, 50 cd (ECE) or 130 cd (SAE) for a yellow turn signal, and 60 cd (ECE) or 80 cd (SAE) for a red brake light, as well as 400 cd (ECE) or 500 cd (SAE) for white daytime running lights, thus requiring more powerful and brighter light-emitting diodes, which have been authorized for use in the automotive industry, and optical systems that make optimal use of the light from the light-emitting diodes in order to be able to generate a brake light or turn signal with a smaller number of pixels/segments, and to be able to develop and obtain different light symbols with the available segmented matrix display.

An increasingly popular trend in motor vehicle production involves illuminated logos on motor vehicles, e.g. logos indicating the manufacturer, model, vehicle specifications, design version, motorization, etc. Lighting devices can comprise LEDs aimed at or surrounding a logo. Other ways to light logos include fiber optics, in particular on the edges, that backlight part of the logo, e.g. a transparent panel that is printed or coated with a film. A broad range of constantly changing guidelines and regulations must be taken into consideration as well.

Another broad field of application is the integration of such a logo in an existing, acceptable, or legally required signal function for the motor vehicle. A logo in a grill or on the hood at the front of the motor vehicle can be lit with a white light, such that in addition to showing the logo, it also functions as a light indicating the location of the motor vehicle at the front, e.g. in the form of a strip light extending over the width of the vehicle. The logo can also be on the rear of the vehicle and lit with a red light, thus functioning as a taillamp on the motor vehicle.

BRIEF SUMMARY OF THE INVENTION

The object of the invention is to therefore create a better lighting device, with which a logo can be integrated in a signaling function for the motor vehicle. This lighting device is also preferably less expensive, more compact, and has a design that can be readily adapted to various uses.

These problems are solved by the subject matter disclosed herein. The features and details disclosed in the context of the lighting device according to the invention also apply to the lighting system according to the invention and the motor vehicle according to the invention, and vice versa, such that reference can always be made to the disclosure of individual aspects of the invention with regard thereto.

According to another aspect of the invention, the above object is also achieved with a lighting device for a motor vehicle that is designed to display light symbols. The lighting device contains a printed circuit board that is populated with numerous light-emitting diodes, and a reflector element. The reflector element is on the same side of the printed circuit board as the light-emitting diodes. The reflector element is divided into numerous segments, and each light-emitting diode is dedicated to a segment that reflects the light away from the printed circuit board in a beam direction. An optical element in the lighting device is placed downstream of the reflector element in the beam direction, which extends over at least part of the reflective surface on the reflecting element, and has a variety of optical properties over the reflective surface.

The printed circuit board preferably has numerous conductor paths that connect the light-emitting diodes to a control unit with which the lighting device is controlled. The light-emitting diodes preferably emit light directly. The light-emitting diodes are preferably attached to the printed circuit board, e.g. soldered thereto, such that they are electrically connected to the conductor paths.

The reflector element is designed to reflect and preferably delimit the light emitted by the light-emitting diodes. The reflector element is therefore designed to conduct the light emitted by the light-emitting diodes away from the printed circuit board in the beam direction with the reflective surface. The beam direction is preferably orthogonal to the surface of the printed circuit board. The reflector element can also be designed to conduct the light emitted by the light-emitting diodes diagonally away from the printed circuit board in relation to the beam direction, thus obtaining a light beam in the form of a cone or pyramid, etc.

This reflector element is divided into numerous segments for this, with at least one light-emitting diode for each segment. There can also be two or more light-emitting diodes dedicated to a segment. By way of example, the light-emitting diodes can be micro-LEDs. The two or more light-emitting diodes are preferably close together, e.g.

directly abutting one another. This has the advantage that the two or more light-emitting diodes can be more easily perceived as a single light source, thus reducing the requirements for the optical layer. It is also preferred that there are one, two, or more light-emitting diodes for numerous segments.

The segments can be triangular, rectangular, pentagonal, hexagonal, or have another polygonal shape. The shape refers to the cross section of the segment, as seen when looking down onto the segment of the reflector element. Parts of the optical element can therefore be illuminated that resemble a corresponding shape of the segments, i.e. a triangular shape, rectangular shape, pentagonal shape, or hexagonal shape. This makes it possible to display different light symbols by lighting numerous segments with the lighting device. Triangular segments are particularly ideal for obtaining a wide variety of different light symbols.

According to the invention, numerous segments can be combined on the reflector element in rows and columns to obtain a repeating pattern. This repeating pattern of the segments of various shapes makes it possible to obtain a large variety of designs and displays of different light symbols. In particular, the shape of the patterns can correspond to the segments or shapes of the segments, in particular such that numerous segments can be combined to obtain a new shape that differs from the shape of the segments. By way of example, the patterns can form a rectangle, or a honeycomb. Specifically, triangular segments can be combined to obtain a rectangular or square pattern, and a honeycomb pattern can be obtained with hexagonal segments. By way of example, four triangles can be combined to obtain a rectangle. The light-emitting diodes can also be arranged in a corresponding pattern on the printed circuit board. The printed circuit board can therefore be populated with a repeating pattern of groups of eight light-emitting diodes. This arrangement can be described as an O-pattern, in which four light-emitting diodes are connected together by an imaginary circle.

The light-emitting diodes for a specific segment can all be of the same color. Each of the light-emitting diodes in a segment can preferably be switched on and off individually. The use of numerous light-emitting diodes in a segment has the advantage that it is possible to obtain more light, such that the lighting device according to the invention is brighter in each segment than a conventional lighting device, and therefore over the entire light-emitting surface of the lighting device. The light-emitting diodes can preferably be dimmed.

The optical element is placed in relation to the printed circuit board such that at least part of the light from the light-emitting diodes and the light reflected by the reflective surface on the reflector element strikes the optical element. It may be the case that part of the light passes by the optical element. According to the invention, the optical element extends over at least part of the reflective surface of the reflector element, and has a variety of optical properties over the reflective surface. In the framework of the invention, different optical properties are understood to mean that different parts of the optical element act in different ways on the light striking it from the reflective surface. These ways can include deflection, color change, diffusion, absorption, changes in the wall thickness, etc. Parts of the optical element can also function as blinds, or be covered by a blind on the vehicle body, which completely blocks the light, thus increasing the contrast of the desired light surface in relation to the surroundings. By advantageously combining the light-emitting diodes with the reflector element and the optical element, a variety of optical effects can be obtained, which can be made to stand out by the optical element in particular because of the different optical properties of the various parts of the optical element. In this context, this comprises raising or enhancing, i.e. in a dominating manner, an optical impression when looking at the lighting device, in particular at a distance of 1 to 5 meters from the lighting device.

That the lighting device is designed for a motor vehicle means in particular that it can be used, specifically, in a motor vehicle. The same lighting device according to the invention could also be used elsewhere. It is nevertheless designed specifically for use in the automotive field. The lighting device can therefore be a motor vehicle lighting device in particular. By way of example, the lighting device can be designed as a taillight, auxiliary light, front light, headlamp, etc.

According to a preferred embodiment of the invention, the optical element has at least one opaque region. An opaque region is a part of the optical element that absorbs and/or reflects light, through which no, or comparatively very little, light can pass. The opaque region is preferably formed in the middle of the optical element. The opaque region can also extend over the rim, e.g. the edge, of the optical element, or it can be adjacent thereto. This opaque region can also be obtained with a blind, e.g. formed on the body of the vehicle. The visual impression obtained with the optical element is enhanced by this transparent region.

The optical element preferably has at least one transparent or translucent region. A transparent region is understood to be a region through which light can pass, which has no, or only a negligible, diffusing effect on the light. The transparent region can contain a prism, or be designed to obtain an effect similar to that of a prism. The transparent region is preferably formed in the middle of the optical element. The transparent region can also extend over the rim, e.g. the edge, of the optical element, or it can be adjacent thereto. The visual impression obtained with the optical element is enhanced by this transparent region.

The optical element particularly preferably contains an image, and/or symbol, and/or letter, and/or numeral. An image can be an outline of an object, for example. The image can also contain other elements, e.g. surface areas, colors, shading, etc. A symbol can be a character with a deeper meaning. The letter or numeral can also be a sequence of letters or numerals, or a combination of letters and numerals. Punctuation marks, special characters, or other characters can also be used. According to the invention, the optical element is preferably designed as a logo, e.g. for identifying the manufacturer or model of the motor vehicle. The visual impression obtained with the optical element is enhanced by this transparent region.

The reflector element is preferably located between the printed circuit board and an optical layer in the lighting device that acts as a diffusor. This optical layers makes it impossible to look from the outside directly at the light-emitting diodes and reflector element. The optical layer preferably has a diffusing effect on light. The optical layer can be a film, pane, pigment layer, etc. The optical layer is preferably frosted. This type of optical layer at least largely eliminates the need for blinds. This also enhances the visual impression obtained with the optical element.

The optical element preferably has a wall thickness of 0.2 mm to 1.2 mm. Particularly preferably, the optical layer has a thickness of 0.2 mm to 0.5 mm. If the optical layer is composed of two diffusion films on top of one another, one of the diffusion films preferably has a thickness of 0.1 mm to 0.5 mm, and the second diffusion film has a thickness of 0.1 mm to 0.2 mm. The light conducting effects can be further reduced by these minimal thicknesses. This results in a better contrast, and therefore an improved, sharper display for an observer of the lighting device. Instead of diffusion films, thin, sprayed optical panes can also be used, with thicknesses of 0.5 mm to 1.2 mm.

The spacing between the light-emitting diodes and the optical layer can also be less than 15 mm, preferably less than 12 mm, more preferably less than 10 mm, and particularly preferably less than 8 mm.

The lower limit for the spacing can be at least 2 mm, particularly at least 4 mm, and more particularly at least 6 mm. This results in a particularly compact and thin lighting device.

According to the invention, the optical layer is preferably placed between the reflector element and the optical element. The optical layer preferably extends over the entire reflective surface of the reflector element. The optical layer is preferably made of plastic. The optical element is preferably placed on the optical layer and held in place, e.g. with an adhesive. The optical element is preferably smaller than the optical layer, such that the optical element only covers part of the optical layer. Individualized production of the lighting device can be improved by this means, in particular with numerous different optical elements.

The optical element also preferably has a light emission sector ranging from 90° to 180°. A light emitting sector is understood to be a region that can be illuminated by the lighting device. This light emitting sector can also contain "blind spots" within the light emitting sector, which can be obtained with one or more opaque regions in the optical element. To obtain this light emitting sector, the optical element preferably is preferably raised above the other components in the lighting device, such that light can be emitted through the lateral surfaces of the optical element obtained in this manner. By this means, a visually enhanced illuminated object as well as signal functions for the motor vehicle, e.g. turn signals, can be obtained simultaneously with the optical element.

The light-emitting diodes are preferably white light-emitting diodes, and/or monochrome light-emitting diodes, and/or color-changing light-emitting diodes, which can be controlled individually or in groups. Monochrome light-emitting diodes are preferably yellow, orange, or red light-emitting diodes. There is preferably at least one reflector element for numerous light-emitting diodes of different colors, which can preferably be switched on and off individually as well as collectively, such that light spots can be generated with colors that change over time. This same effect can also be obtained using color-changing light-emitting diodes. Color-changing light-emitting diodes are light-emitting diodes that emit light with different wavelengths over time, thus obtaining different colors. The optical element can be lit in an animated manner with these light-emitting diodes, e.g. with colors and/or light intensities that change over time, such that the visual impression can be enhanced with the optical element.

According to another aspect of the invention, the object specified above is also achieved with a lighting system for a motor vehicle that contains at least one lighting device according to the invention and a control unit for a light symbol display obtained with the lighting device.

The lighting device can preferably be controlled by the control unit, or the electronics in the control unit, to display a large variety of content. The control unit is preferably designed to control the lighting devices separately, i.e. individually. The control unit is particularly preferably designed to control the individual light-emitting diodes in the lighting devices in a targeted manner. The control unit can be configured to control at least two of the lighting devices in order to display a light symbol therewith.

"Content" in the framework of the invention is understood to mean illuminated lines, stripes, or surface areas in the lighting device, in which the symbols obtained with lines or stripes can have one or more direction changes (bends) with which a legally required signal function, e.g. daylight running lights, turn signals, brake lights, or taillights or navigation lights can be obtained. This content can also refer to individual pictograms and symbols, traffic signals or symbols such as arrows, pedestrians, or warning signals, e.g. indicating emergency braking, with which a safety lane can be formed, or a breakdown, etc., can be indicated. "Content" can also refer to an illumination of the optical element that follows an outline, an inner shape, a limited lighting of surfaces of the optical element, etc. This content, which can be obtained by lighting the optical element with numerous light-emitting diodes, or the segments thereof, are what are understood to be light symbols in the framework of the invention. These light symbols can be stationary or dynamic. A stationary light symbol is understood to be a light symbol that does not change over time. Dynamic light symbols are those that change over time.

The lighting system according to the invention preferably contains numerous lighting devices according to the invention, in which the control unit is configured to control at least two of these lighting devices with which a single light symbol is displayed. A single light symbol is understood in this case to be a light symbol that is obtained with at least two coordinated lighting devices with which the same, or coordinated content is displayed by the light-emitting diodes. The light-emitting diodes in a segment of the lighting device preferably have different colors, and the lighting system is designed to display numerous different light signals. The display of light symbols can be improved with these different colors, e.g. red, green, yellow, blue, white, etc. Numerous different colors can therefore be obtained with the targeted activation of the light-emitting diodes in the individual segments.

According to a third aspect of the invention, the object of the invention is also obtained with a motor vehicle that contains a lighting device according to the first aspect of the invention, or a lighting system according to the second aspect of the invention.

The lighting devices are preferably located on sides of motor vehicle body, e.g. in lateral receivers in the body. The optical element is preferably raised at least in part above a contour line on the body such that light from the optical element forms a lateral marking or an auxiliary turn signal.

The lighting device can also follow a curvature of the motor vehicle, in which case the individual lighting devices are at different angles that follow the curvature at each position of the respective lighting devices.

The module structure of the overall lighting device allows the individual modules to be fit to the curvature of the front or rear of the vehicle, such that the modules can be arranged in a sequence to obtain a curved lighting device in which the individual modules can all be integrated and retained in a single housing. This modular structure also has advantages in the event of an accident, e.g. in a collision or if one or more LEDs on a printed circuit board malfunction, because only the damaged modules or components, e.g. printed circuit boards, need to be replaced. This has advantages in particular from an economic perspective and with regard to insurance claims, as well as for recycling purposes in terms of sustainability and efficient use of resources.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION OF THE DRAWINGS

Figure 1:
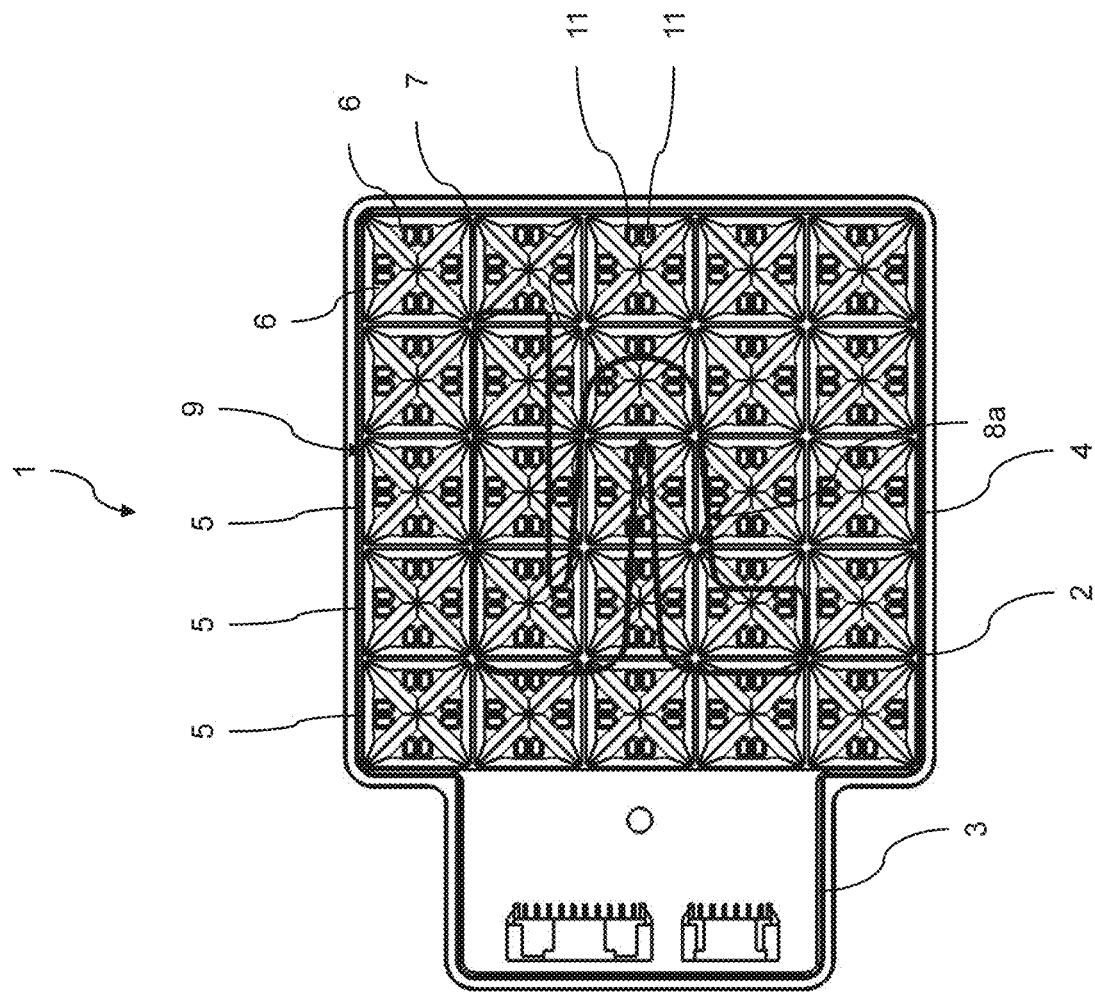
FIG. 1 shows a lighting device from above, without a housing, according to a preferred exemplary embodiment of the invention.
Figure 2:
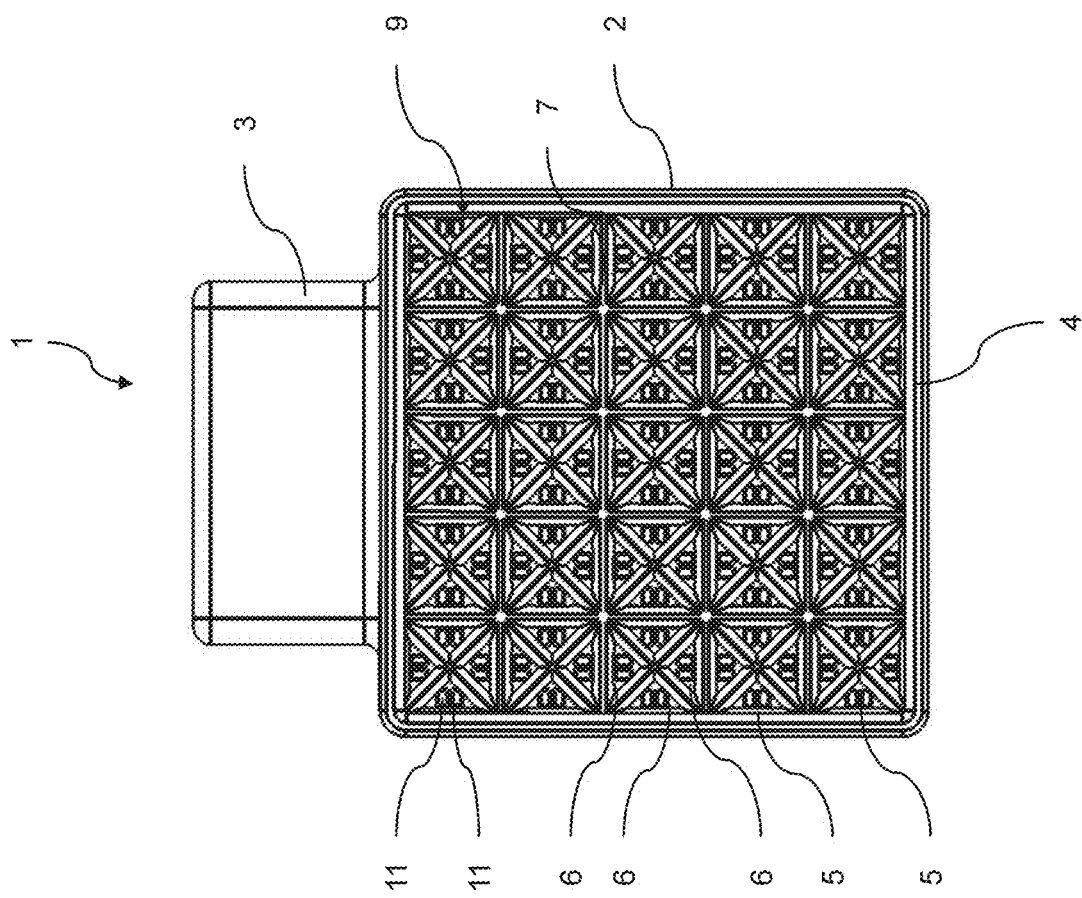
FIG. 2 shows the lighting device in FIG. 1 from above, with a housing and without an optical element.
Figure 3:
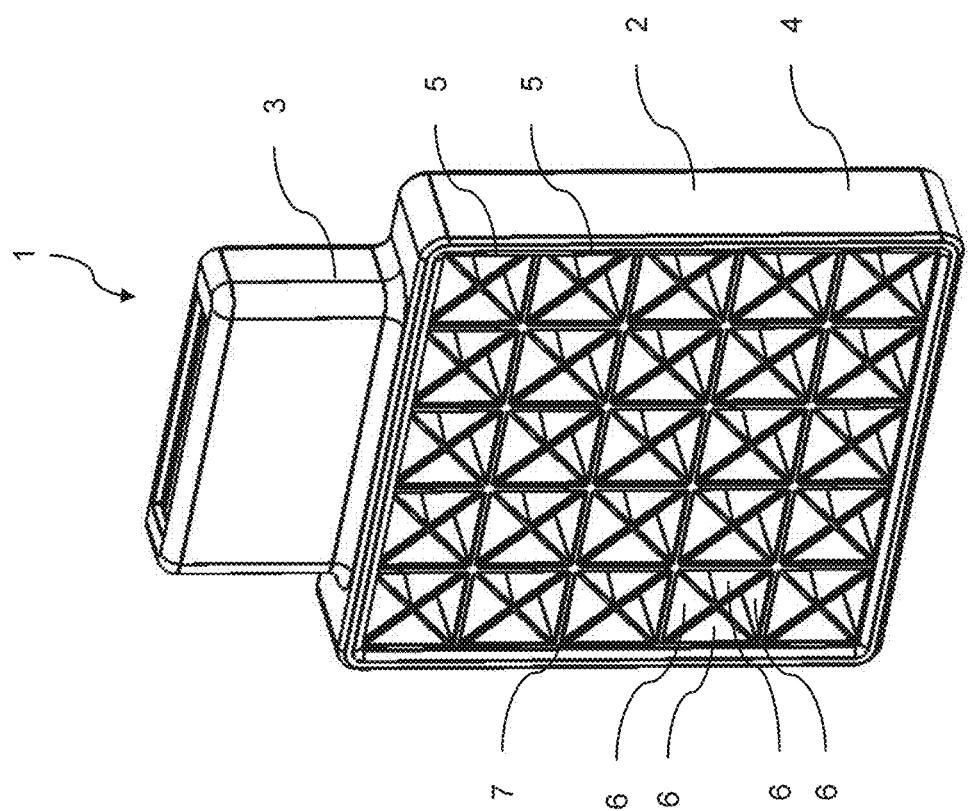
FIG. 3 shows the lighting device in FIG. 2 from a diagonal perspective.

The same or identical elements have the same reference symbols in FIGS. 1 to 15. For purposes of clarity, not all of the same or identical elements have a reference symbol in all of the figures.

FIGS. 1 to 11 show a lighting device 1 according to a first exemplary embodiment of the invention, from above and from various perspectives.

The lighting device 1 comprises a housing 4 in the form of a housing frame that has a first housing part 2 and second housing part 3. The housing 4 is relatively thin in relation to its width and length. In other words, the housing 4 forms a plate, or is flat. The housing 4, in particular the first housing part 2, is rectangular in the present case, in particular square, such that the overall lighting device 1 is rectangular. The housing 4, or the lighting device 1, can also have another shape, e.g. rectangular, round, oval, or it can have some other arbitrary shape.

As can be seen in FIGS. 1 to 4, the lighting device 1 contains a reflector element 9 comprising numerous patterns 5, each of which has multiple segments 6. These patterns 5 are square, and each contain four segments 6, each of which forms an isosceles triangle, such that the pattern 5 is completely filled therewith. A first element part 8a of an optical element 8 (see FIG. 6) in the form of a logo is indicated in front of the reflector element 9.

The reflector element 9 contains the square patterns 5 arranged in five adjacent lines and five adjacent columns, each of which is subdivided into four segments 6. The reflector element 9 in the present case forms an integral element containing all of the patterns 5 and segments 6. The segments 6 could also be produced separately, but this is more difficult. The reflector element 9 can be placed on a printed circuit board 10 (see FIG. 5), such that in each case, two light-emitting diodes 11 on the printed circuit board extend into a segment 6 of the reflector element 9, such that each of the segments 6 in this example encompasses two light-emitting diodes 11 from the side and in their entirety.

The individual segments 6 can be illuminated individually and evenly with the light-emitting diodes 11 behind them. In this case, there are two light-emitting diodes 11 in each segment 6, which can preferably be controlled separately, and also preferably have different colors, i.e. can emit light of different wavelengths. Each of the segments 6 could also have just one light-emitting diode 11 or more than two light-emitting diodes 11. The light-emitting diodes 11 illuminate the respective segments 6. The walls of the segments 6 are designed to reflect the light from the light-emitting diodes 11 within the respective segments 6. There is an optional grid mask 7 in front of the reflector element 9. The grid mask 7 is flush with the walls of the segments 6, such that these walls are covered by the grid mask 7, leaving the interiors of the segments 6 free.

Figure 5:
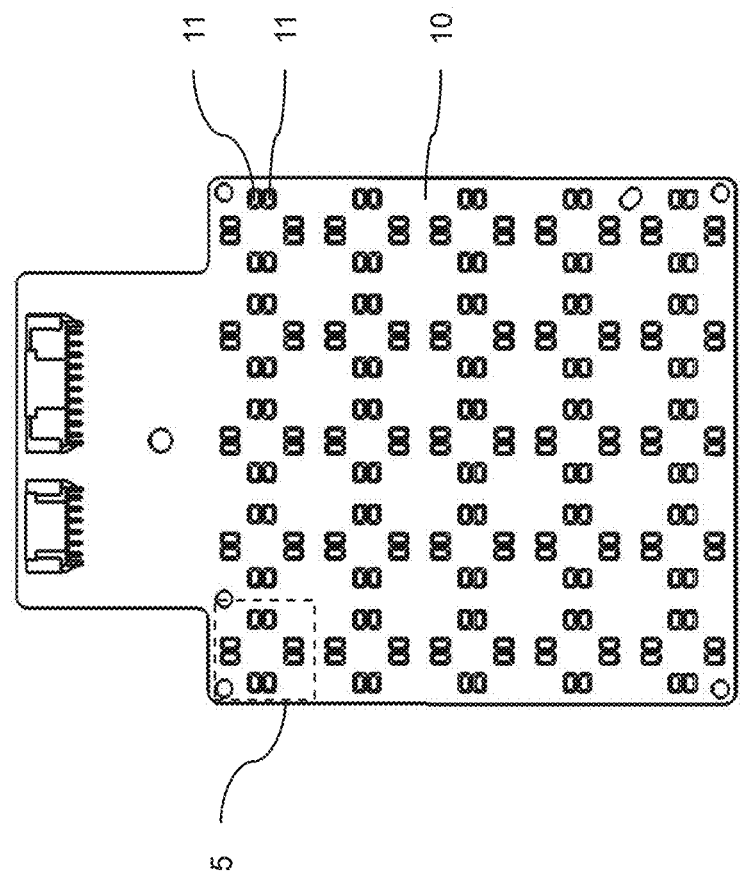
FIG. 5 shows a printed circuit board for the lighting device in FIG. 1 from above.

FIG. 5 shows a printed circuit board 10 for the lighting device 1 in FIG. 1 from above. It is clear that there are four pairs of light-emitting diodes 11 in each square pattern 5. The light-emitting diodes 11 thus form a repeating O-pattern that corresponds to the patterns 5.

Figure 6:
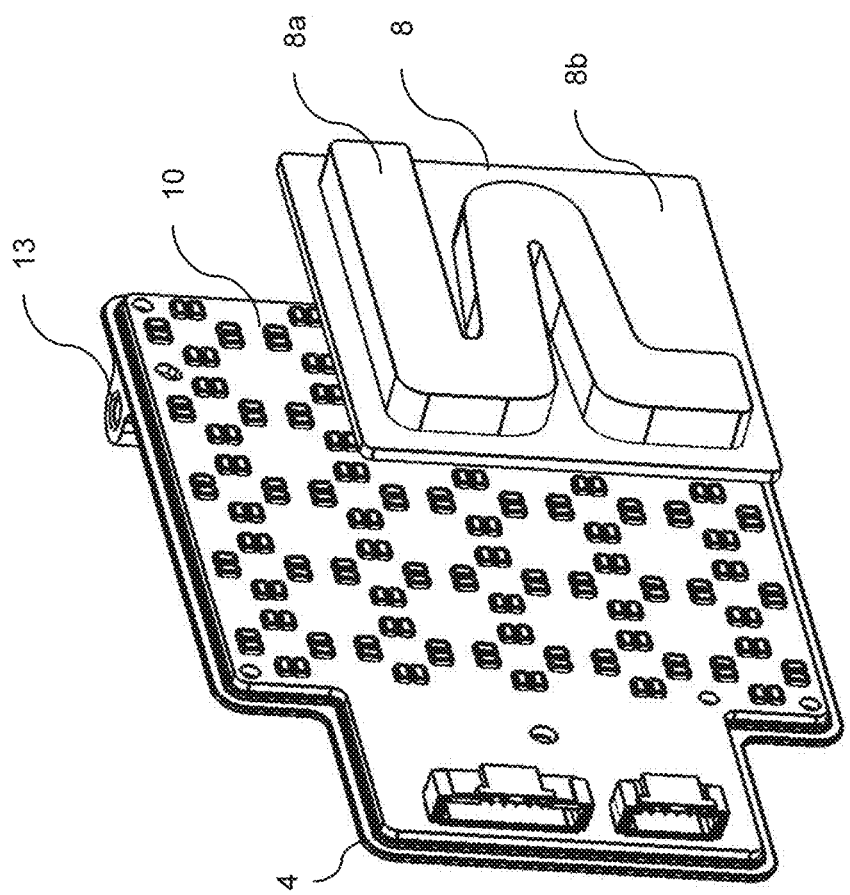
FIG. 6 shows a diagonal perspective of the printed circuit board in FIG. 5, with an optical element.
Figure 7:
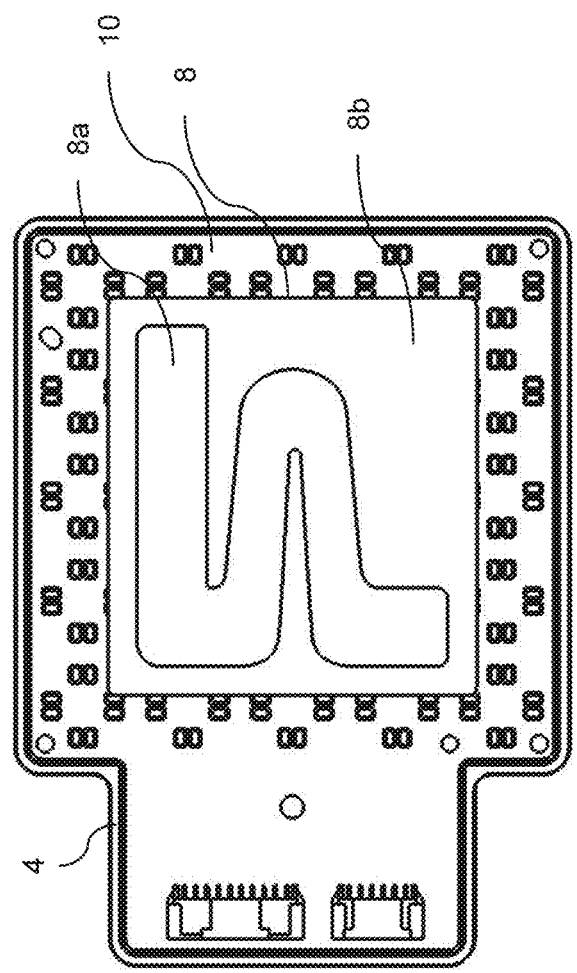
FIG. 7 shows the printed circuit board from above, with the optical element in FIG. 6.

FIG. 6 shows a diagonal view of the printed circuit board 10 in FIG. 5, with an optical element 8 in front of it. FIG. 7 shows the printed circuit board 10 from above, with the optical element 8 placed in front of it. The printed circuit board 10 is placed on a rear wall of the housing 4. A mounting flange 13 is formed on the rear wall of the housing 4. The reflector element 9 is not shown here. It is clear in FIG. 7 in particular that the optical element 8 only covers part of the light-emitting surfaces of the light-emitting diodes 11 on the printed circuit board 10. The optical element 8 has a raised first element region 8a that forms a logo, and a second element region 8b that is flat. The first element region 8a and second element region 8b have different optical properties. The first element region 8a can be designed, for example, to absorb light at the upper surface, or reflect this light back to the printed circuit board, and to allow light to pass through the sides, e.g. through diffusion. The second element region 8b can be transparent or translucent, in particular in the form of an optical diffusor. The upper surface of the first element region 8a can also be transparent or translucent, in particular in the form of an optical diffusor.

Figure 4:
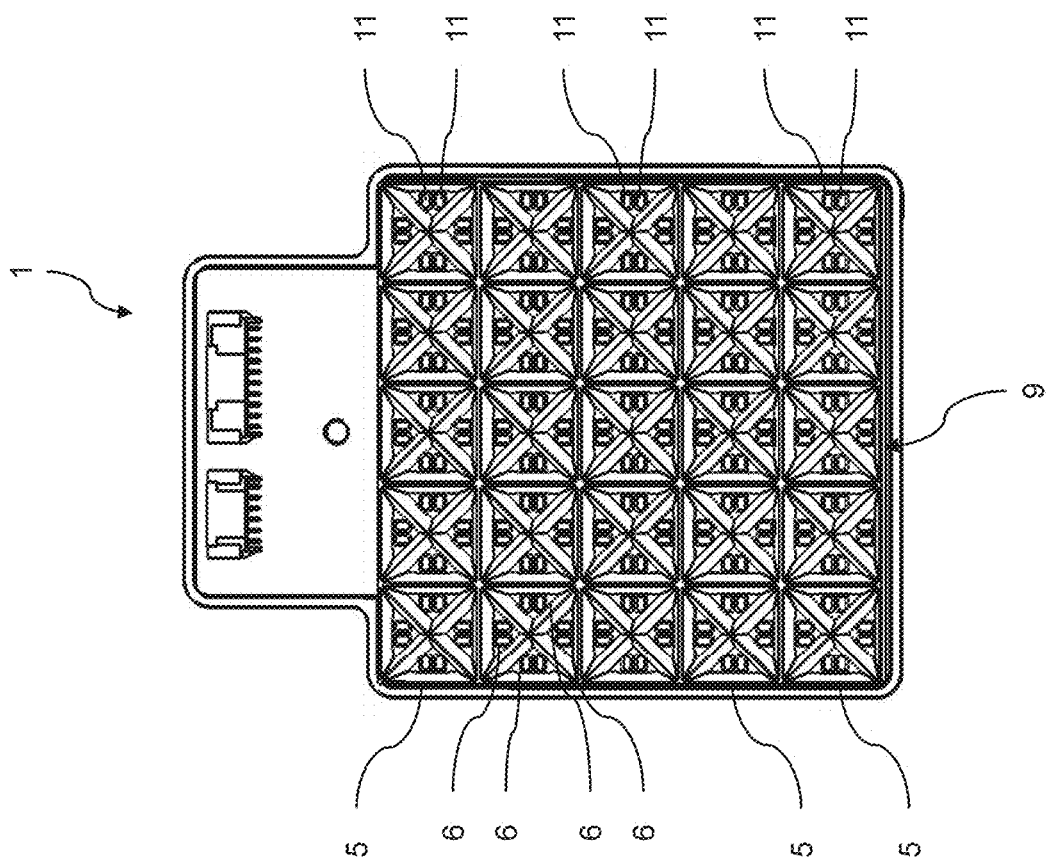
FIG. 4 shows the lighting device in FIG. 2 from above, without a housing and without a grid mask.
Figure 8:
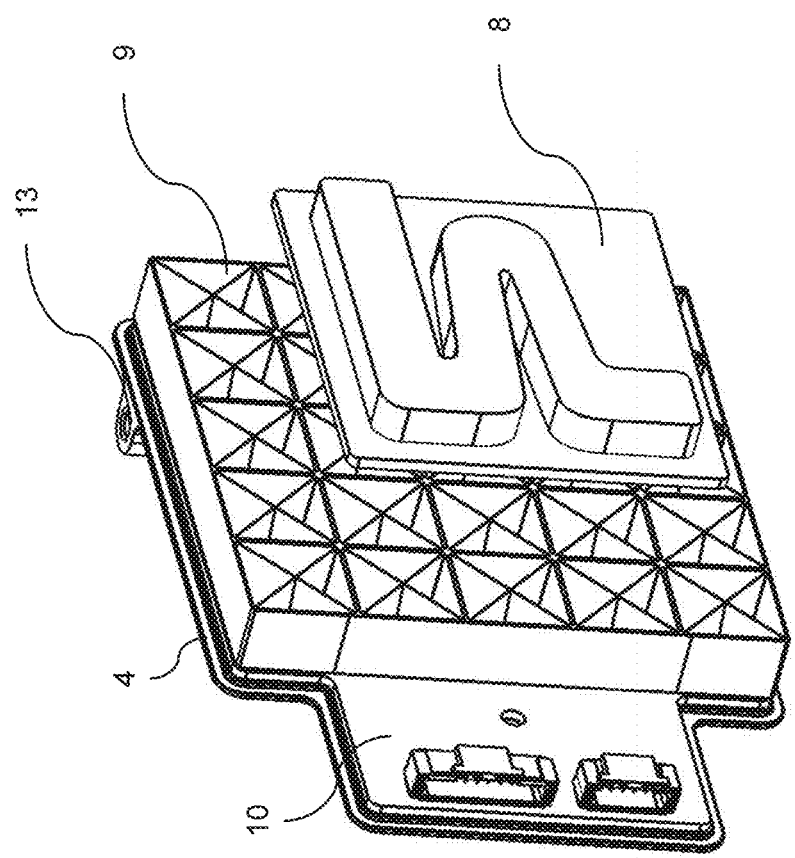
FIG. 8 shows a diagonal perspective of the lighting device in FIG. 4 with an optical element.
Figure 9:
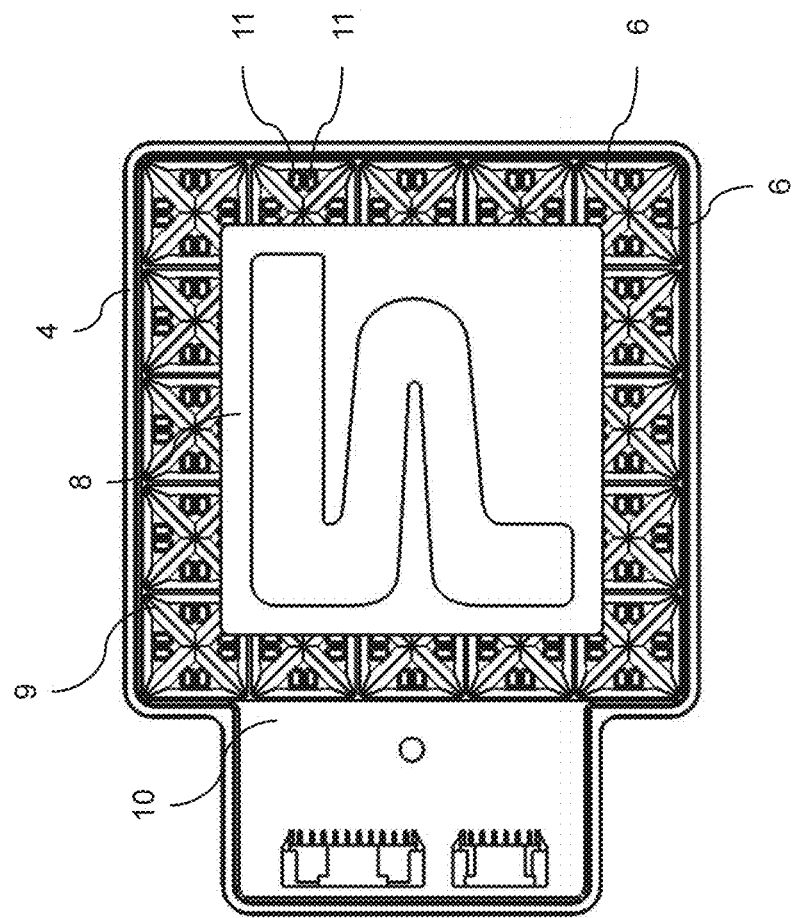
FIG. 9 shows the lighting device in FIG. 8 from above.

FIG. 8 shows a diagonal view of the lighting device 1 in FIG. 4, with an optical element 8 placed in front of it. FIG. 9 shows the printed circuit board 10 from above, with the optical element 8 placed in front of it. Only the rear wall of the housing 4 is shown.

Figure 10:
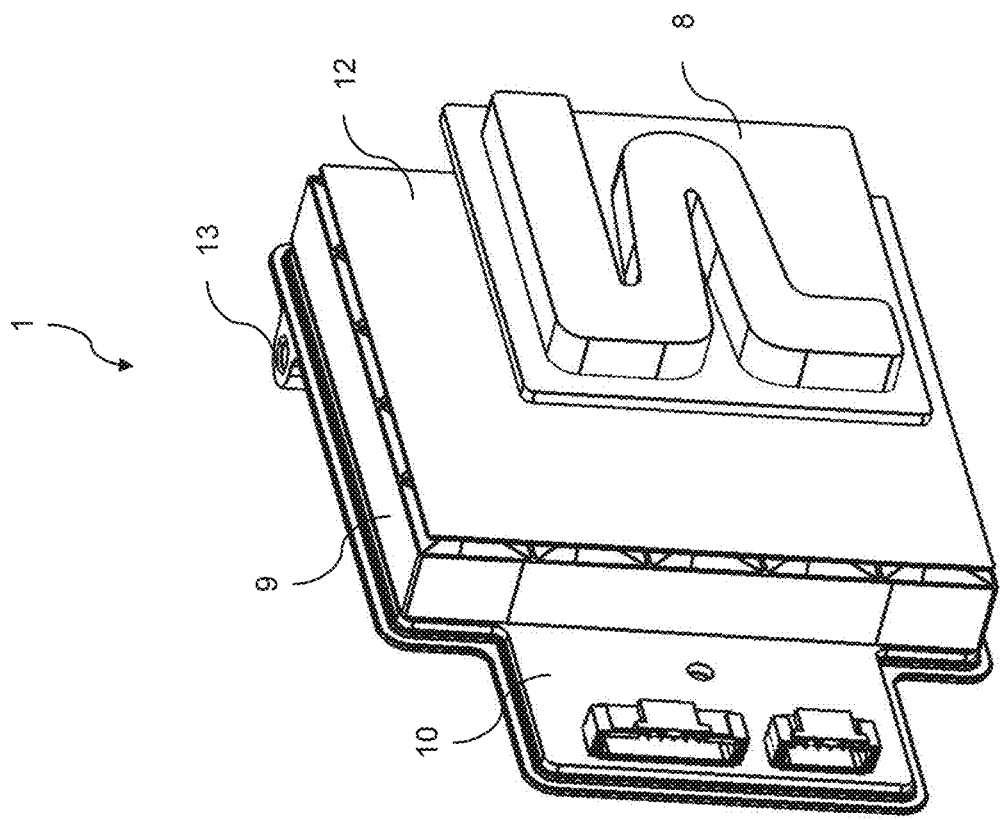
FIG. 10 shows a diagonal perspective of the lighting device in FIG. 9, with an additional optical layer.
Figure 11:
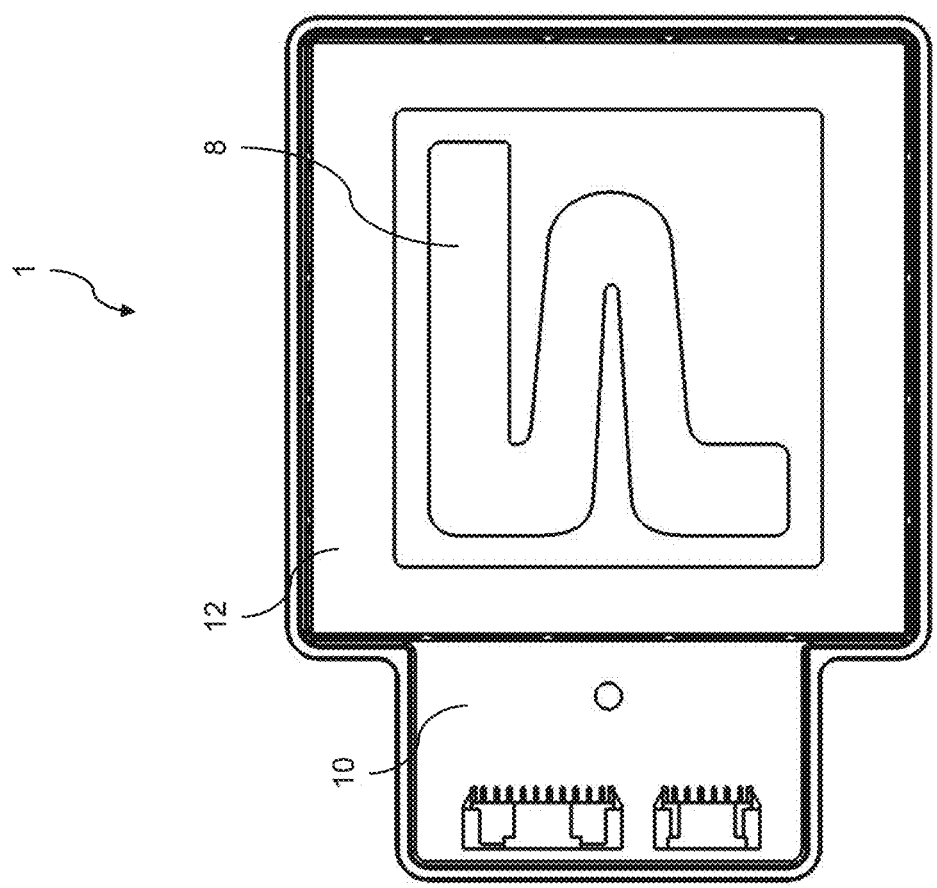
FIG. 11 shows the lighting device in FIG. 10 from above.

FIG. 10 shows a diagonal view of the lighting device 1 in FIG. 9, in which an optical layer 12 is placed between the reflector element 9 and the optical element 8. FIG. 9 shows the printed circuit board 10 from above, with the optical element 8 placed in front of it. The optical layer 12 is preferably an optical diffusor, diffusor film, etc. and completely covers a reflective region of the reflector element 9.

Figure 12:
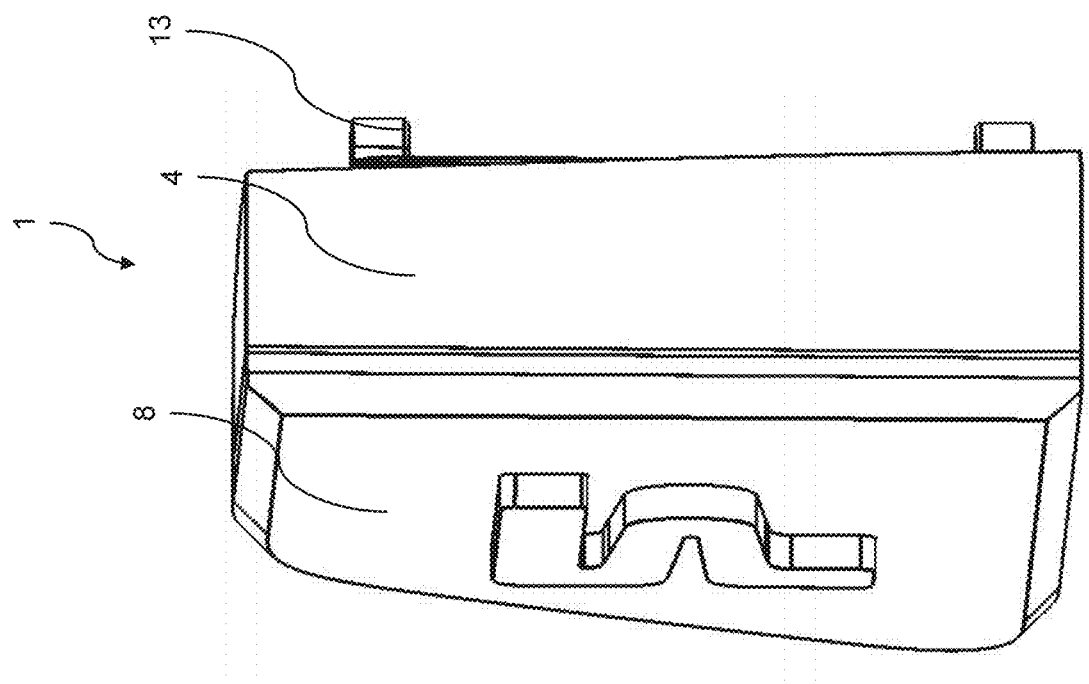
FIG. 12 shows a diagonal perspective of the lighting device according to a preferred third embodiment of the invention.
Figure 13:
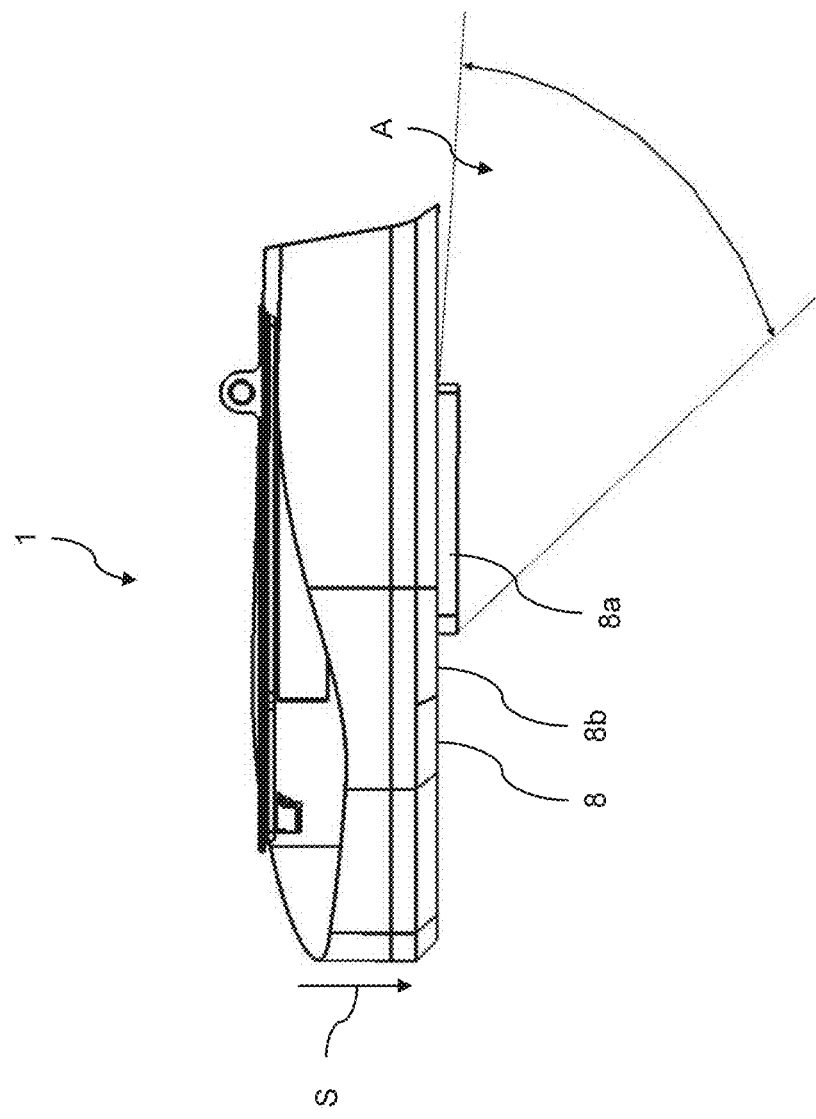
FIG. 13 shows a side view of the lighting device in FIG. 12.
Figure 14:
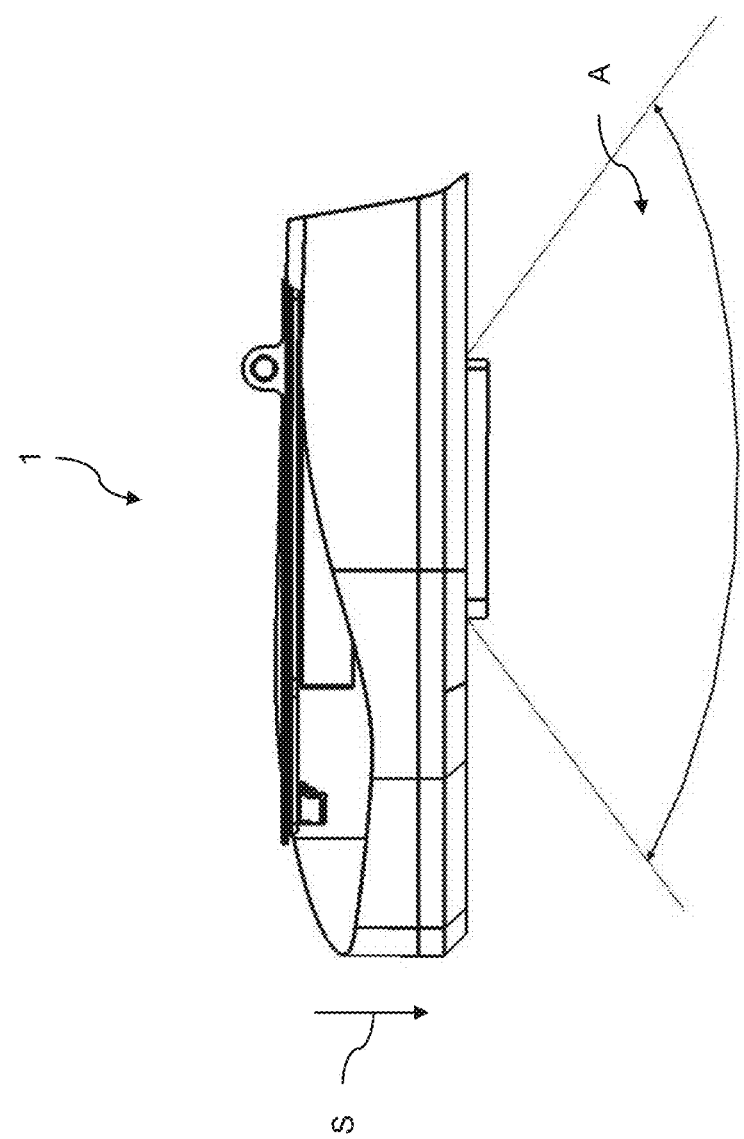
FIG. 14 shows a side view of a lighting device according to a preferred third embodiment of the invention.

FIGS. 12 to 14 show a lighting device 1 according to a second exemplary embodiment of the invention, in both perspective views and from above. The optical element 8 in this second exemplary embodiment completely covers the reflective surface of the reflector element 9, such that there is no need for an additional optical layer 12.

The beam direction S of the light-emitting diodes 11 obtained with the reflector element 9, as well as various light emitting sectors A of the lighting device 1, are shown by way of example in FIGS. 13 and 14. The light-emitting sector A is obtained by the formation of the raised first element region 8a. As a result, the lighting device 1 can satisfy the requirements for a lateral marking light or for an auxiliary turn signal.

Figure 15:
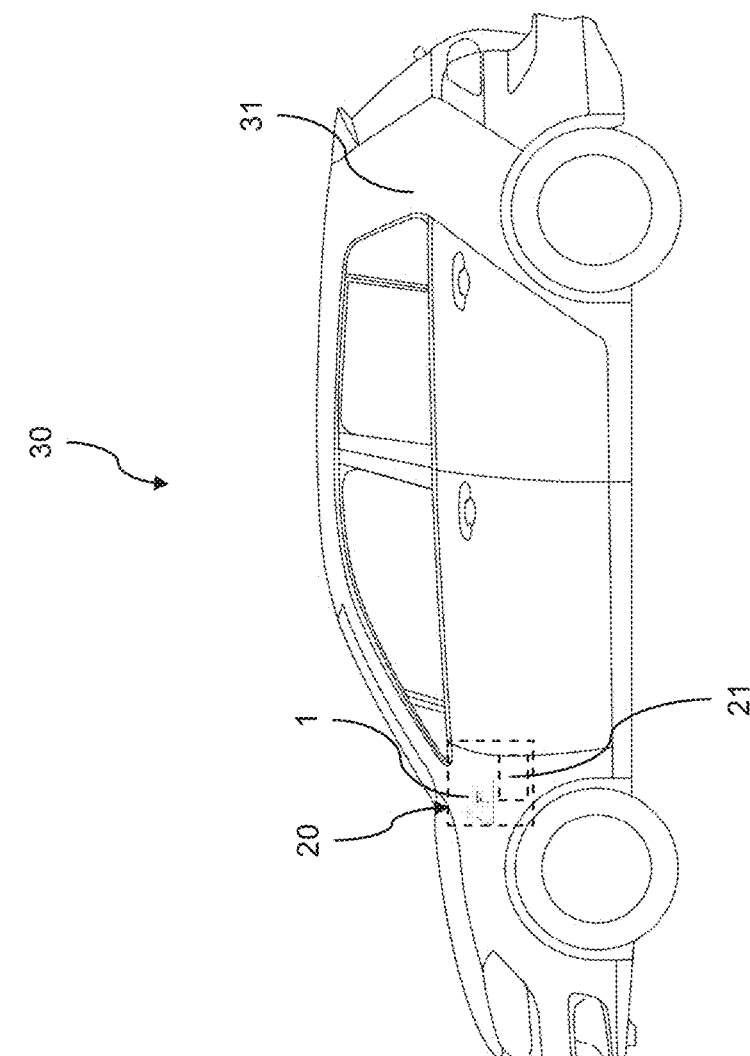
FIG. 15 shows a side view of a motor vehicle according to a preferred exemplary embodiment of the invention.

FIG. 15 shows a side view of a motor vehicle 30 according to a preferred exemplary embodiment of the invention. A preferred embodiment of the lighting device 1 according to the invention in a lighting system 20 is placed in a lateral receiver on the body 31 of the motor vehicle 30 at the rear, and thus integrated in the body 31 of the motor vehicle 30, such that the first element region 8a of the optical element 8 is raised laterally from the contour line of the body 31. As a result, the light emitted from the lighting device 1 can be seen from motor vehicles 30 that are travelling both in front of and behind the motor vehicle 30. The lighting device 1 forms a light marking the sides of the vehicle or a supplementary turn signal. The lighting system 20 has a control unit 21 that controls the light-emitting diodes 11 in the lighting device 1 in a targeted manner.

LIST OF REFERENCE SYMBOLS 1 lighting device
2 first housing part
3 second housing part
4 housing
5 pattern
6 segment
7 grid mask
8 optical element
8a first element region
8b second element region
9 reflector element
10 printed circuit board
11 light-emitting diode
12 optical layer
13 mounting flange
20 lighting system
21 control unit
30 motor vehicle
31 body
A light-emitting sector
S beam direction

The invention claimed is:

1. A lighting device for a motor vehicle, the lighting device comprising:
a printed circuit board populated with numerous light-emitting diodes;
a reflector element positioned on a side of the printed circuit board, wherein the light-emitting diodes are also positioned on said side of the printed circuit board, wherein the reflector element is subdivided into numerous polygonal segments that can be combined to form light patterns having the shape of a polygon, and wherein each light-emitting diode is dedicated to a segment that reflects light from each of the light-emitting diodes away from the printed circuit board in a beam direction(S);
an optical element positioned downstream of the reflector element in the beam direction (S), wherein the optical element extends over at least part of a reflective surface of the reflector element, and the optical element has a variety of optical properties over this reflective surface, and
a diffusing optical layer positioned between the reflector element and the optical element.

2. The lighting device according to claim 1, wherein the optical element contains at least one region that is opaque.

3. The lighting device according to claim 1, wherein the optical element has at least one transparent region.

4. The lighting device according to claim 1, wherein the optical element has at least one region forming an optical diffusor.

5. The lighting device according to claim 1, wherein the optical element contains an image, and/or a symbol, and/or a letter, and/or a numeral.

6. The lighting device according to claim 1, wherein the optical element has a light emitting sector(S) ranging from 90° to 180°.

7. The lighting device according to claim 1, wherein the light-emitting diodes are white light-emitting diodes, and/or monochrome light-emitting diodes, and/or color-changing light-emitting diodes, which can be controlled individually or in groups.

8. A lighting system for a motor vehicle, the lighting system comprising:
at least one lighting device according to claim 1;
a control unit for controlling a light symbol display of the lighting device.

9. The lighting system according to claim 8, further including numerous lighting devices, wherein the control unit controls at least two of the numerous lighting devices to display a light symbol.

10. A motor vehicle that contains a lighting device according to claim 1.

11. A motor vehicle that contains a lighting system according to claim 8.

12. The lighting device according to claim 1, wherein the optical layer has a thickness between 0.2 mm and 0.5 mm.

13. The lighting device according to claim 1, wherein the optical layer includes a first diffusion film adjacent to a second diffusion film, wherein the first diffusion film has a thickness between 0.1 mm and 0.5 mm, and wherein the second diffusion film has a thickness between 0.1 mm and 0.2 mm.

14. The lighting device according to claim 1, wherein the optical layer is separated from the light-emitting diodes by a distance greater than 2 mm and less than 15 mm.

15. The lighting device according to claim 1, wherein two or more light-emitting diodes directly abutting each other are dedicated to each of the polygonal segments of the reflector element.

* * * * *